United States Patent
Chaiken et al.

(10) Patent No.: US 6,853,510 B2
(45) Date of Patent: Feb. 8, 2005

(54) HIGH-SPEED LOW-CAPACITIVE LOAD COMMON MODE FEEDBACK

(75) Inventors: Alan I. Chaiken, Chandler, AZ (US); Mark J. Chambers, Gilbert, AZ (US)

(73) Assignee: Texas Instruments Incorporated, Dallas, TX (US)

(*) Notice: Subject to any disclaimer, the term of this patent is extended or adjusted under 35 U.S.C. 154(b) by 292 days.

(21) Appl. No.: 09/970,191

(22) Filed: Oct. 3, 2001

(65) Prior Publication Data

US 2002/0054445 A1 May 9, 2002

Related U.S. Application Data

(60) Provisional application No. 60/237,993, filed on Oct. 5, 2000.

(51) Int. Cl.[7] ................................................. G11B 5/02
(52) U.S. Cl. ........................................... 360/67; 360/46
(58) Field of Search ............................... 360/67–68, 46; 330/252, 253, 254, 284

(56) References Cited

U.S. PATENT DOCUMENTS

| | | | |
|---|---|---|---|
| 4,833,418 A | * 5/1989 | Quintus et al. ............... 330/9 |
| 5,898,341 A | * 4/1999 | Miyashita .................. 330/253 |
| 5,999,056 A | 12/1999 | Fong | |
| 6,011,437 A | 1/2000 | Sutardja et al. | |
| 6,020,786 A | 2/2000 | Ashby | |
| 6,028,478 A | 2/2000 | Seremeta et al. | |
| 6,208,209 B1 | * 3/2001 | Ng ............................. 330/279 |
| 6,359,743 B1 | * 3/2002 | Patti et al. .................... 360/25 |

* cited by examiner

Primary Examiner—Sinh Tran
Assistant Examiner—Varsha A. Kapadia
(74) Attorney, Agent, or Firm—W. Daniel Swayze, Jr.; W. James Brady; Frederick J. Telecky, Jr.

(57) ABSTRACT

A variable gain amplifier to output a differential output signal includes an input circuit to input a differential input signal, a buffer circuit to buffer the differential output signal to a common mode voltage, a compensation circuit to compensate the differential output signal to prevent variation in the differential output signal, and a comparison circuit to compare the common mode voltage to a predetermined voltage and to adjust the common mode voltage to equal the predetermined voltage.

6 Claims, 2 Drawing Sheets

HIGH-SPEED LOW-CAPACITIVE LOAD COMMON MODE FEEDBACK

This application claims priority under 35 USC § 119(e)(1) of provisional application Ser. No. 60/237,993, filed Oct. 5, 2000.

FIELD OF THE INVENTION

The present invention relates to a variable gain amplifier (VGA) and a method of compensation.

BACKGROUND OF THE INVENTION

Many communication applications and hard disk drive units, particularly a read channel found in hard disk drives, require some sort of variable gain that is exponentially proportional to an input control voltage. Since on a dB scale, the gain curve becomes a straight line; this is commonly referred to as "linear-in-dB." Examples of where a linear-in-dB variable gain is required are in transceivers for cellular phones as well as in read channels. Most VGA circuits accomplish the desired linear-in-dB behavior by, one way or another, exploiting the exponential characteristic of a bipolar transistor. A well-known technique relies on the fact that the ratio of the collector currents of a bipolar differential pair is exponentially dependent on the differential input voltage. FIG. 1 shows a differential pair of bipolar transistors Q1 and Q2 with common emitters biased by a tail current "Itail" from current source 5 and their bases controlled by a differential input voltage $V_{in+}$, $V_{in-}$ at differential inputs 1 and 2. The relationship between the collector currents $I_{out+}$ and $I_{out-}$ at the outputs 3 and 4 and the input voltages $V_{in+}$ and $V_{in-}$ can be described as $$\frac{I_{out-}}{I_{out+}} = e^{\frac{q(V_{in+}-V_{in-})}{kT}} \quad (1)$$

where q is the charge of the electron, k is Boltzmann's constant, and T represents the absolute temperature. The fact that it is the ratio of the collector currents that exhibits the linear-in-dB behavior enables the bipolar differential pair to be used for a wide range of variable gain circuits that rely on current ratios to set their gain.

Some VGA circuits employ a comparison circuit that compares a common mode voltage $V_{cm}$ to a predetermined voltage, and if there is a difference between the common mode voltage $V_{cm}$ and the predetermined voltage, a feedback signal is employed to either raise or lower the common mode voltage $V_{cm}$ so that $V_{cm}$ approximately equals the predetermined voltage. This technique introduces problems in that instability can occur.

SUMMARY OF THE INVENTION

The present invention provides a circuit which prevents rapid and large changes of the common mode voltage. Additionally, the present invention provides a circuit that employs a capacitor, namely a compensation capacitor, to constrain the common mode voltage.

The compensation technique utilizes negative feedback to set the output voltage common mode. Improperly compensated, the common mode circuit can become unstable and oscillate at a high frequency. The purpose of the compensation capacitor is to set a pole frequency to stabilize the system and prevent oscillating behavior. The compensation capacitor is placed at an AC ground in the signal path, thus not causing any signal bandwidth degradation. It is placed at the same time at a high impedance node for common mode feedback (CMFB) and can thus produce a large RC time constraint with reasonable values of capacitance (1 PF) to stabilize the CMFB circuit. Other CMFB techniques load the output of the amplifier with resistors or capacitors causing a bandwidth (BW) reduction in the signal path.

DETAILED DESCRIPTION OF THE PRESENT INVENTION

The following invention is described with reference to figures in which similar or the same numbers represent the same or similar elements. While the invention is described in terms for achieving the invention's objectives, it can be appreciated by those skilled in the art that variations may be accomplished in view of these teachings without deviation from the spirit or scope of the invention.

Figure 1:
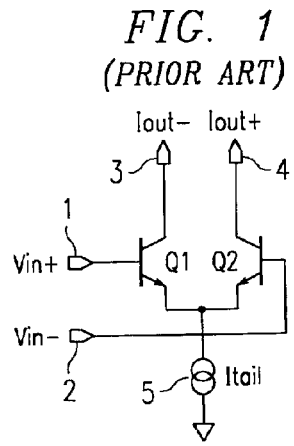
FIG. 1 illustrates a voltage gain amplifier.
Figure 4:
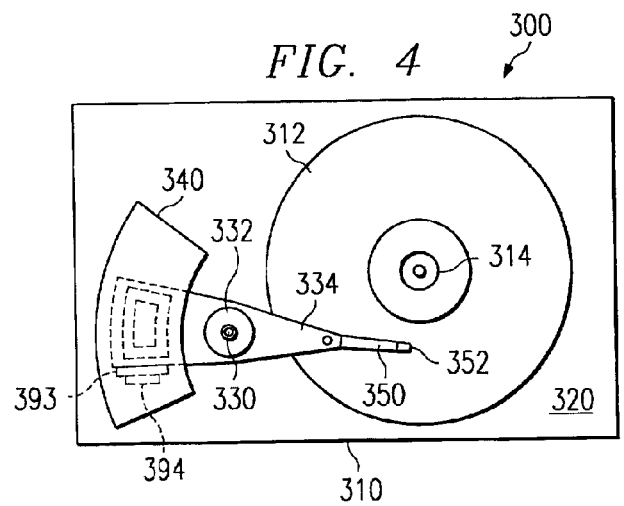
FIG. 4 illustrates a top view of the system.
Figure 3:
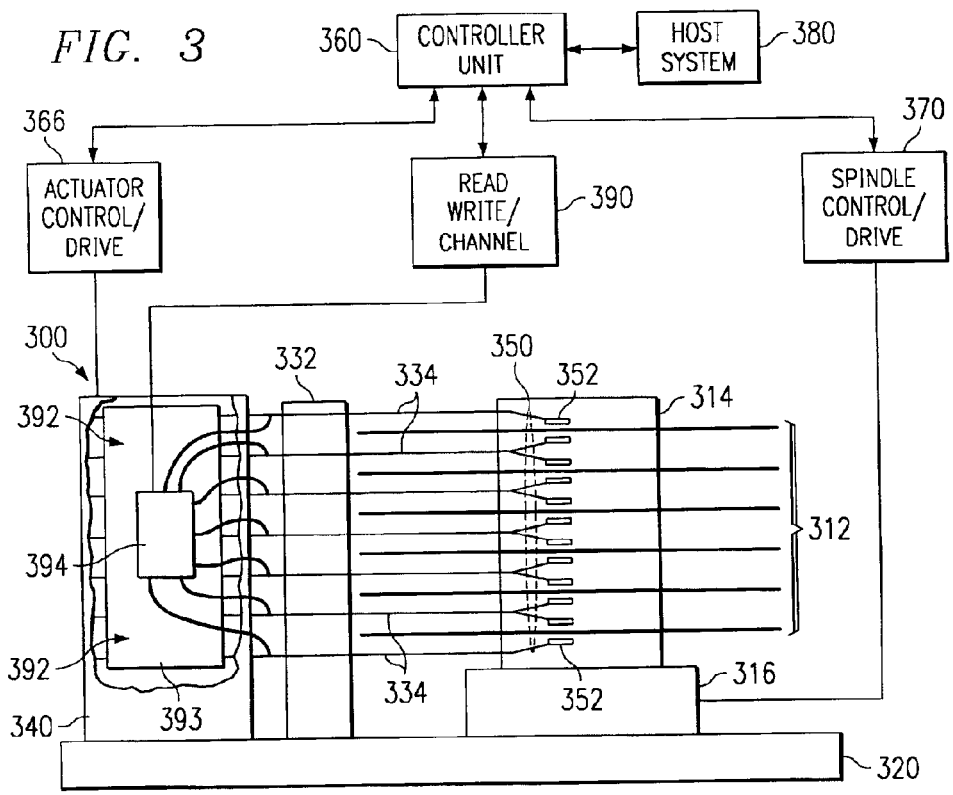
FIG. 3 illustrates a side view of a system.

FIGS. 3 and 4 show a side and top view, respectively, of the disk drive system designated by the general reference 300 within an enclosure 310. The disk drive system 300 includes a plurality of stacked magnetic recording disks 312 mounted to a spindle 314. The disks 312 may be conventional particulate or thin film recording disk or, in other embodiments, they may be liquid-bearing disks. The spindle 314 is attached to a spindle motor 316 which rotates the spindle 314 and disks 312. A chassis 320 is connected to the enclosure 310, providing stable mechanical support for the disk drive system. The spindle motor 316 and the actuator shaft 330 are attached to the chassis 320. A hub assembly 332 rotates about the actuator shaft 330 and supports a plurality of actuator arms 334. The stack of actuator arms 334 is sometimes referred to as a "comb." A rotary voice coil motor 340 is attached to chassis 320 and to a rear portion of the actuator arms 334.

A plurality of head suspension assemblies 350 is attached to the actuator arms 334. A plurality of inductive transducer heads 352 is attached respectively to the suspension assemblies 350, each head 352 including at least one inductive write element. In addition thereto, each head 352 may also include an inductive read element or a MR (magneto-resistive) read element. The heads 352 are positioned proximate to the disks 312 by the suspension assemblies 350 so that during operation, the heads are in electromagnetic communication with the disks 312. The rotary voice coil motor 340 rotates the actuator arms 334 about the actuator shaft 330 in order to move the head suspension assemblies 350 to the desired radial position on disks 312.

A controller unit 360 provides overall control to the disk drive system 300, including rotation control of the disks 312 and position control of the heads 352. The controller unit 360 typically includes (not shown) a central processing unit (CPU), a memory unit and other digital circuitry, although it should be apparent that these aspects could also be enabled as hardware logic by one skilled in the computer arts. Controller unit 360 is connected to the actuator control/drive unit 366 which is in turn connected to the rotary voice coil motor 340. A host system 380, typically a computer system or personal computer (PC), is connected to the controller unit 360. The host system 380 may send digital data to the controller unit 360 to be stored on the disks, or it may request that digital data at a specified location be read from the disks 312 and sent back to the host system 380. A read/write channel 390 is coupled to receive and condition read and write signals generated by the controller unit 360 and communicate them to an arm electronics (AE) unit shown generally as 392 through a cut-away portion of the voice coil motor 340. The AE unit 392 includes a printed circuit board 393, or a flexible carrier, mounted on the actuator arms 334 or in close proximity thereto, and an AE module 394 mounted on the printed circuit board 393 or carrier that comprises circuitry preferably implemented in an integrated circuit (IC) chip including read drivers, write drivers, and associated control circuitry. The AE module 394 is coupled via connections in the printed circuit board to the read/write channel 390 and also to each read head and each write head in the plurality of heads 352. The read/write channel 390 may include the variable gain amplifier as illustrated in FIG. 2.

Figure 2:
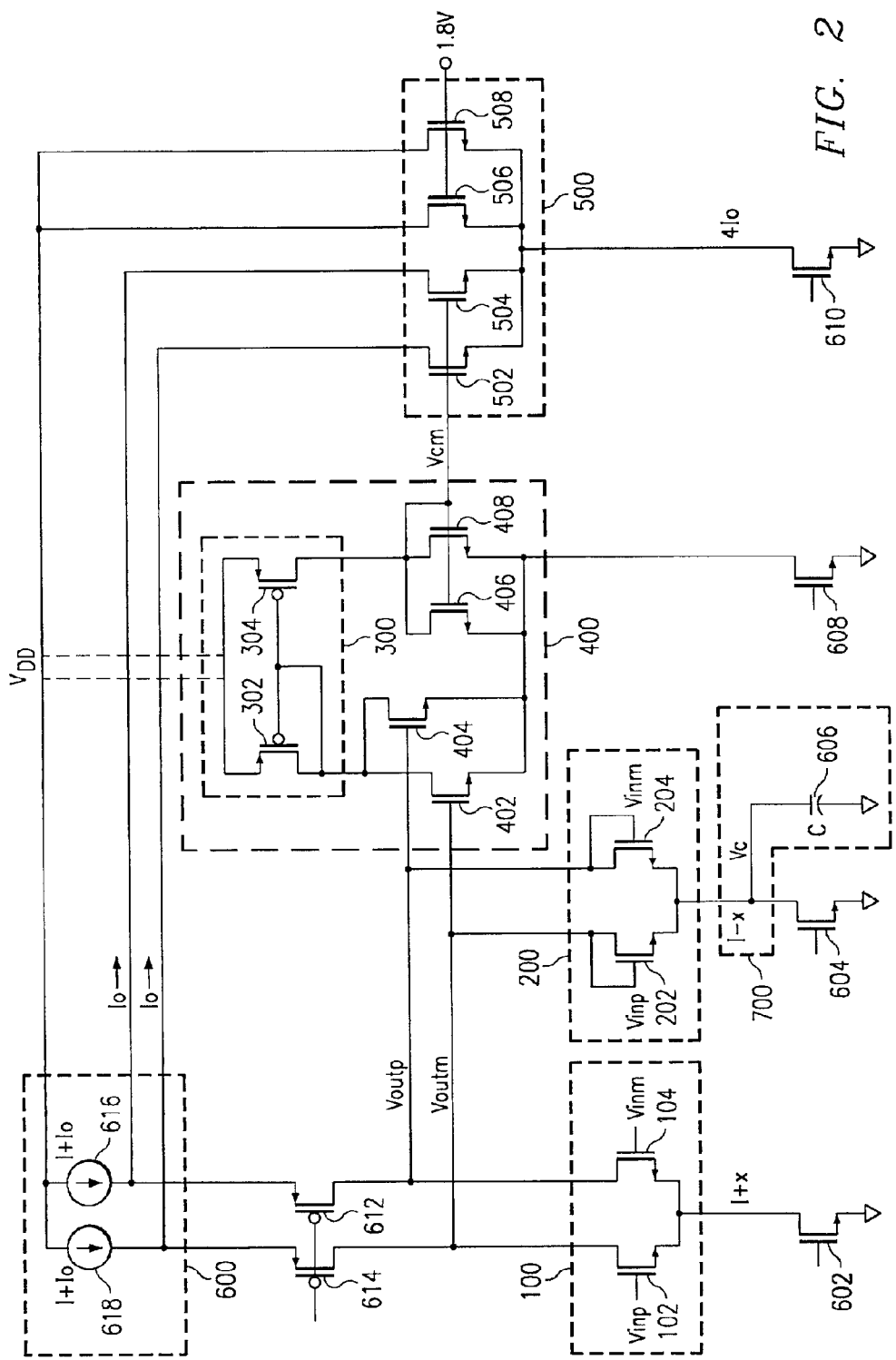
FIG. 2 illustrates a voltage gain amplifier of the present invention.

FIG. 2 illustrates an input circuit differential pair 100 coupled to a cascoded diode load circuit 200, which is coupled to a buffer circuit 400. The buffer circuit 400 is connected to a comparator circuit 500. The comparator circuit 500 is connected to a current generator circuit 600, which is in turn connected to input circuit differential pair 100. Furthermore, a compensation circuit 700 is connected to the cascoded diode load circuit 200. This circuit gives a gain:

$$\sqrt{\frac{1+X}{1-X}} = \frac{gm_{input}}{gm_{load}} \quad (2)$$

Although the present invention is described in terms of a specific implementation involving NFETs and PFETs, other implementations are possible using bipolar devices.

Current generator 618 is connected to the source of PFET 614. The drain of PFET 614 is connected to the drain of NFET 102. The source of NFET 102 is connected to the source of NFET 104 which is connected to the drain of NFET 602. The gate of NFET 102 receives the voltage $V_{inp}$. Likewise, the gate of NFET 104 receives the voltage $V_{inm}$. The differential input voltage $V_{inm}$ and $V_{inp}$ is input to input circuit 100. The drain of NFET 102 is connected to the gate of NFET 402, and the drain of NFET 102 is connected to the gate and drain of NFET 202. The drain of NFET 104 is connected to the gate of NFET 404, and the drain of NFET 104 is connected to the drain of NFET 204 as well as the gate of NFET 204. The source of NFET 202 is connected to the source of NFET 204. The capacitor 606 is connected to the sources of NFET 202 and NFET 204. Additionally, the drain of NFET 604 is connected to the source of NFET 202 and to the source of NFET 204, and the source of NFET 604 is connected to ground.

The buffer 400 includes a current mirror 300. The current mirror 300 includes two PETS, namely PFET 302 and PFET 304. PFET 302 has a source connected to the source of PFET 304 while the drain and gate of PFET 302 is connected to the gate of PFET 304. The drain of PFET 302 is connected to the drain of NFET 402 as well as the drain of NFET 404. The source of NFET 404 and the source of NFET 402 are connected together and provide a first and second current path for current through PFET 302. One current path, namely a first current path, may go through NFET 402 while the other current path, a second current path, may go through NFET 404. Likewise, the drain of PFET 304 is connected to the drain of NFET 406 and NFET 408. NFET 406 has a source connected to a source of NFET 408. The gates of NFET 406 and NFET 408 are connected together. Another current path goes through PFET 304 as well as NFET 406 or NFET 408. Thus, the current through PFET 302 equals the current through PFET 304 by action of the current mirror 300. The source of NFET 404 is connected to the source of NFET 406 and connected to the source of NFET 408. The sources of NFET 402, NFET 404, NFET 406 and NFET 408 are connected to the drain of NFET 608. The source of NFET 608 is connected to ground.

The gate of NFET 406 and the gate of NFET 408 are connected to the gate of NFET 502 and the gate of NFET 504. The source of NFET 502 and the source of NFET 504 are connected together. The drain of NFET 502 is connected to the output of current source 618 while the drain of NFET 504 is connected to the output of current source 616. The source of NFET 502 is connected to the source of NFET 504 and connected to the source of NFET 506 and the source of NFET 508. The sources are connected together to the drain of NFET 610. The drain of NFET 506 is connected to the drain of NFET 508 which is connected to voltage $V_{DD}$. The gate of NFET 506 is connected to the gate of NFET 508 which is connected to a predetermined voltage; for example, 1.8 volts. A current mirror is connected to the gate of NFET 610 to maintain a current through the drain to source of NFET 610 with a magnitude of 4Io. This current through NFET 610 may be divided up through NFET 502, NFET 504, NFET 506 and NFET 508. The sources of NFET 402, NFET 404, NFET 406 and NFET 408 all sum to form the current through NFET 608. A differential DAC is connected to the gate of NFET 604 to control the current through NFET 604 from drain to source so that the magnitude of the current is I−x, and is likewise connected to the gate of NFET 602 to control the current from the drain to the source of NFET 602 at a magnitude of I+x.

The voltage $V_{inp}$ or voltage $V_{inm}$ varies, changing the amount of current flowing through NFET 102 and NFET 104, respectively. This, correspondingly, changes the voltage at the drain of NFET 102 and the voltage at the drain of NFET 104, respectively. This voltage at the drain of NFET 102 and at the drain of NFET 104 is $V_{outp}$ and $V_{outm}$, respectively. If these voltages vary in opposite directions but equal magnitude, NFET 402 and NFET 404 will regulate the current through the buffer 400 so that no net current change occurs. If $V_{outm}$ rises and $V_{outp}$ decreases, the current will increase through NFET 402 and decrease through NFET 404. Thus, there is no net change in current through the two transistors. The voltages $V_{outm}$ and $V_{outp}$ are differential output voltages. However, if both $V_{outp}$ and $V_{outm}$ change in the same direction, for example if both $V_{outp}$ and $V_{outm}$ increase, this will result in a net increase through NFET 402 and NFET 404. By action of the current mirror, the current through NFET 304 will increase, and the current through NFET 406 and NFET 408 will correspondingly increase. This increase in current through NFET 406 and NFET 408 will raise the voltage across the gates of NFET 406 and NFET 408, raising the voltage $V_{cm}$ (the common mode voltage). If the voltage $V_{cm}$ is raised, this raised $V_{cm}$ will increase the current through NFET 502 and NFET 504 as a result of the voltage at the gate being raised. Thus, the comparator 500 would no longer be in equilibrium as a result of the unequal voltage. Necessarily, since the total current is equal to 4Io, the current through NFET 506 and the current through NFET 508 will increase. The increasing current through NFET 506 and NFET 508 will decrease the current from the current generators 618 and 616, respectively. By action of the division of current through a node, since increased current is being drawn through NFET 502 and NFET 504, less current will flow through NFET 614 and NFET 612. This lower current will cause the voltage $V_{outp}$ and voltage $V_{outm}$ to decrease, decreasing the current through NFET 402 and NFET 406. As a result of the current mirror, the current through NFET 406 and NFET 408 will be reduced, reducing the voltage $V_{cm}$. A similar but reverse operation will occur if $V_{outp}$ and $V_{outm}$ both fall. Thus, the circuit is placed back into equilibrium. However, a circuit without the compensation circuit 700 can oscillate. Correspondingly, NFET 202 and NFET 404 act as diodes, allowing current to flow through NFET 202 and NFET 204 to compensation circuit 700. In one embodiment, the compensation circuit may be a capacitor such as 1pF connected from the source of NFET 402 and NFET 404, and the other end of the capacitor being connected to ground. This capacitor is charged up in accordance with the voltages $V_{outm}$ and voltage $V_{outp}$. When the voltage $V_{outp}$ and the voltage $V_{outm}$ increase rapidly, the compensation circuit 700 tends to restrain the voltages from increasing rapidly, thus providing accurate compensation and preventing the circuit from oscillating. Likewise, when the voltage $V_{outp}$ and the voltage $V_{outm}$ decrease rapidly, the compensation circuit again tends to restrain the voltage $V_{outp}$ and $V_{outm}$ from decreasing too rapidly.

What is claimed is:

1. A variable gain amplifier to output a differential output signal, comprising:
   an input circuit to input a differential input signal;
   a buffer circuit to buffer the said differential output signal to generate a common mode voltage;
   a compensation circuit to compensate said differential output signal to prevent variation in said differential output signal; and
   a comparison circuit to compare said common mode voltage to a predetermined voltage and to adjust said common mode voltage to equal said predetermined voltage,
   wherein said variable gain amplifier includes a diode circuit to connect said compensation circuit to said buffer circuit.

2. A variable gain amplifier, as in claim 1, wherein said compensation circuit includes a capacitor.

3. A system to read and write information to a medium, comprising:
   a head to read and write said information;
   a read channel to receive said information from said head and to condition said information; and
   a controller to receive and transmit said information;
   wherein said read channel includes a variable gain amplifier to output a differential output signal including:
   an input circuit to input a differential input signal;
   a buffer circuit to buffer the said differential output signal to a common mode voltage;
   a compensation circuit to compensate said differential output signal to prevent variation in said differential output signal; and
   a comparison circuit to compare said common mode voltage to a predetermined voltage and to adjust said common mode voltage to equal said predetermined voltage,
   wherein said variable gain amplifier includes a diode circuit to connect said compensation circuit to said buffer circuit.

4. A system, as in claim 3, wherein said compensation circuit includes a capacitor.

5. A variable gain amplifier to output a differential output signal, comprising:
   an input circuit to input a differential input signal and a diode load to produce $V_{out}$;
   a buffer circuit to buffer the said differential output signal to generate a common mode voltage;
   a compensation circuit to compensate said differential output signal to prevent variation in said differential output signal; and
   a comparison circuit to compare said common mode voltage to a predetermined voltage and to adjust said common mode voltage to equal said predetermined voltage,
   wherein said variable gain amplifier includes a diode circuit to connect said compensation circuit to said buffer circuit.

6. A variable gain amplifier, as in claim 5, wherein said compensation circuit includes a capacitor.

* * * * *